United States Patent [19]

Cheung

[11] Patent Number: 5,049,405
[45] Date of Patent: Sep. 17, 1991

[54] METHOD OF THIN FILM DEPOSITION USING LASER ABLATION

[75] Inventor: Jeffrey T. Cheung, Thousand Oaks, Calif.

[73] Assignee: Rockwell International Corporation, El Segundo, Calif.

[21] Appl. No.: 547,531

[22] Filed: Jun. 29, 1990

Related U.S. Application Data

[63] Continuation-in-part of Ser. No. 359,005, May 26, 1989, abandoned.

[51] Int. Cl.$^5$ .................. B05D 3/06; C23C 16/00; C23C 14/00
[52] U.S. Cl. .................. 427/53.1; 427/42; 118/726; 118/730; 118/50.1; 118/620
[58] Field of Search ............ 427/53.1, 42; 118/50.1, 118/620, 726, 727, 730; 156/643; 219/121.66, 121.65, 121.6

[56] References Cited

U.S. PATENT DOCUMENTS

| | | | |
|---|---|---|---|
| 3,538,298 | 11/1970 | Duston et al. | 219/121.6 |
| 3,645,786 | 2/1972 | Tamenberger et al. | 427/42 |
| 4,065,656 | 12/1977 | Brown et al. | 219/121.6 |
| 4,200,382 | 4/1980 | Friedman | 219/121.6 |
| 4,281,030 | 7/1981 | Silfvast | 427/53.1 |
| 4,304,978 | 12/1981 | Saunders | 219/121.6 |
| 4,427,723 | 1/1984 | Swain | 118/50.1 |
| 4,566,936 | 1/1986 | Bowlin | 427/53.1 |
| 4,701,592 | 10/1987 | Cheung | 219/121.66 |
| 4,816,293 | 3/1989 | Hiramoto et al. | 427/53.1 |
| 4,874,741 | 10/1989 | Shaw et al. | 427/53.1 |

OTHER PUBLICATIONS

Bartholomew et al., "Low Temp. Syn. of High-Tc Supeconducting Thin Films by Laser Assisted Reactive Dep.", *High-T Superconductor II*, ed. Capone et al., 4/88.

Burton et al., "Laser Deposition of 1/Ba$_2$Cu$_3$O$_{7-\delta}$ Thin Films", ed. Harper et al., *American Vac. Soc. Series* 3 pp. 166-173, 11/87.

Lynds et al., "Supercond. Thin Films of (RE)Ba$_2$Cu$_3$-(Ag)O$_{7-x}$ Prep. by Pulsed Laser Ablation", ed. Brodsky et al., *High t Supercond.*, pp. 707-710, 11-12/87.

Lynds et al., "High-Tc Superconduct. Thin Films pup. by Pulsed Nd:YAG Laser Ablation", *Amer. Vac. Soc. Series* 3, ed. Harper et al., pp. 159-165, 11/87.

*Primary Examiner*—Shrive Beck
*Assistant Examiner*—Marianne L. Padgett
*Attorney, Agent, or Firm*—John C. McFarren

[57] ABSTRACT

A rotating cylindrical target surface is provided for the laser ablation process of depositing thin films on a substrate. The target is mounted in a vacuum chamber so that it may be rotated about the longitudinal axis of the cylindrical surface target and simultaneously translated along the longitudinal axis. A laser beam is focused by a cylindrical lens onto the target surface along a line that is at an angle with respect to the longitudinal axis to spread the plume of ablated material over a greater radial arc. The plume may be spread in the longitudinal direction by providing a concave or convex lateral target surface. The angle of incidence of the focused laser beam may be other than normal to the target surface to provide a more glancing geometry. Simultaneous roation about and translation along the longitudinal axis produce a smooth and even ablation of the entire cylindrical target surface and a steady evaporation plume. Maintaining a smooth target surface is useful in reducing undesirable splashing of particulates during the laser ablation process and thereby depositing high quality thin films.

10 Claims, 1 Drawing Sheet

METHOD OF THIN FILM DEPOSITION USING LASER ABLATION

This application is a continuation-in-part of application Ser. No. 359,005 filed May 26, 1989, now abandoned.

TECHNICAL FIELD

The present invention relates to the laser ablation process of thin film deposition and, in particular, to a method that reduces the splashing effect of pulsed laser ablation.

BACKGROUND OF THE INVENTION

The process of laser ablation is known in the art of depositing thin films of material on a substrate and is described, for example, in U.S. Pat. No. 4,701,592 entitled "Laser Assisted Deposition and Annealing." The '592 patent also describes an undesirable side effect of pulsed laser ablation termed "splashing", in which solid particles and molten globules ejected from the surface of the laser target cause poor morphology and low crystalline quality of the deposited film.

Splashing has been attributed to two major causes: subsurface boiling and defoliation. Defoliation is a term used to describe the ejection of weakly bonded irregularities from the rough surface of the laser target. Subsurface boiling can be avoided in most processes because it generally occurs only at very high power densities. Defoliation, however, is a more serious problem because irregular surface features, such as deep craters and needle formations, are inevitably produced when a planar target surface is scanned in a raster pattern by a focused laser beam.

Through experimentation it has been determined that splashing is minimized, and thus smooth films are deposited, when a freshly polished target is used for the first time. However, when a target is scanned repeatedly by a focused laser beam in a raster pattern, the surface of the target becomes cratered and the morphology of the film deposited on the substrate deteriorates. Therefore, it is apparent that undesirable splashing due to defoliation can be minimized by maintaining a smooth target surface during laser ablation.

SUMMARY OF THE INVENTION

The present invention includes a method and apparatus for reducing the splashing effect that occurs during the pulsed laser ablation process of depositing thin films on a substrate. The invention comprises configurations of the laser focusing lens and the target that reduce the splashing effect by maintaining a smooth target surface. A smooth target surface minimizes the splashing effect because of the fewer rough surface irregularities subject to defoliation by the focused laser beam.

In one embodiment of the present invention, the target material is configured in the form of a cylindrical solid having a longitudinal axis. The target is mounted in a vacuum chamber on a holder so that the target can be rotated about its axis while it is simultaneously translated along its axis. A laser beam is focused by a cylindrical lens onto the surface of the target at a line that is generally parallel to the longitudinal axis of the target. The angle of incidence of the focused laser beam may be other than normal to the surface to provide a more glancing geometry. The width or spread of the plume of ablated material may be expanded radially by directing the laser beam to strike the cylindrical target surface along a line at an angle with respect to the cylindrical axis. The plume width can also be increased longitudinally by providing an embodiment of the target having a surface that is concave, convex, or spherical, for example. Such a non-flat target surface causes the plume of ablated material to fan out, thus providing uniform film deposition over a greater area of the substrate.

Experiments with the cylindrical target and laser beam focusing lens of the present invention have demonstrated a great reduction in the splashing effect of pulsed laser ablation. The surface of the target remains smooth and may actually become smoother with ablation. In addition, the present configuration allows containerless holding of the target material, thus reducing contamination and increasing the efficiency of use of the target material.

BRIEF DESCRIPTION OF THE DRAWINGS

For a more complete understanding of the present invention and for further advantages thereof, the following Description of the Preferred Embodiments provide reference to the accompanying Drawings, in which.

DESCRIPTION OF THE PREFERRED EMBODIMENTS

The present invention comprises improvements in the apparatus and the process of laser ablation. The invention is particularly useful in depositing uniform thin films on a substrate by reducing the undesirable splashing effect that occurs during laser ablation of target material.

Figure 1:
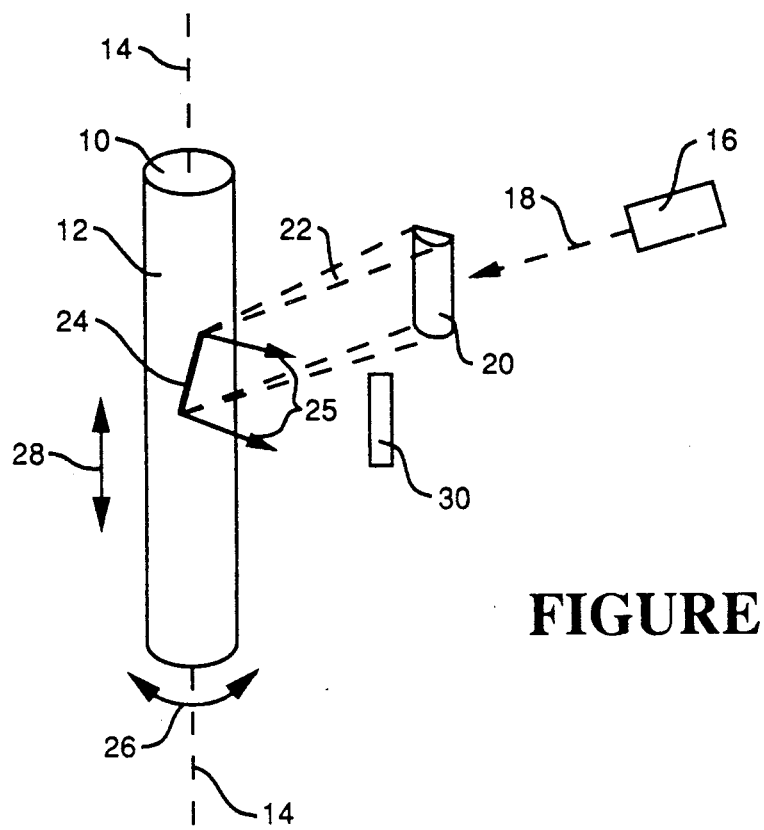
FIG. 1 is a schematic drawing of one embodiment of the laser beam and target configuration of the present invention.

Referring to FIG. 1, a basic embodiment of the present invention is illustrated in simplified schematic form. The components of the invention may be positioned in a typical vacuum chamber using commonly available mounting and positioning means (not shown). The target material 10 subject to laser ablation is configured to have a cylindrical ablative surface 12. Generally, target 10 may be formed as a cylindrical solid having a longitudinal axis 14. A laser 16, such as an excimer laser, generates a laser beam 18. Laser beam 18 is directed through a cylindrical lens 20 that focuses a beam 22 on surface 12 along a line 24. The angle of incidence of focused beam 22 may be other than normal with respect to surface 12 to provide a somewhat glancing angle of incidence of focused beam 22 on surface 12. Target 10 is mounted so as to be rotatable in one or both directions about axis 14, as indicated by arrow 26. In addition, target 10 is mounted so as to be translatable in either direction along axis 14 as indicated by arrow 28. Alternatively, the position of line 24 may be translated over rotating surface 12 by means of a laser beam focusing and directing system as is well known in the art.

In the process of pulsed laser ablation in a controlled atmosphere of a vacuum chamber (not shown), beam 22 is focused at line 24 on surface 12 of target 10. During ablation of surface 12, target 10 is rotated about axis 14. Rotation of target 10 causes surface 12 to remain smooth, thereby reducing the splashing effect caused by defoliation of an irregular target surface. Simultaneously with rotation, target 10 also may be translated along axis 14. Although translation is not a requirement of the present invention, translation of target 10, or the alternative translation of line 24 by a laser beam directing system, provides uniform ablation of the entire surface 12 and allows longer duration of use of the target before it becomes necessary to refocus beam 22. One advantage of translating target 10 with respect to fixed laser beam 22, rather than translating beam 22 over surface 12, is that a fixed beam and a translating target produce an evaporation plume, as indicated by arrows 25, that remains steady and substantially fixed in space relative to a substrate 30. In the preferred embodiment of the present invention, the laser induced plume 25 of ablated target material is very steady, thereby producing improved thin film deposition on the substrate 30.

The configuration of the present invention has been used in pulsed laser ablation with an angle of incidence of beam 22 of approximately twenty degrees and a rotation of target 10 of approximately 10-15 rpm. In experiments depositing the superconducting material YBaCuO, the particle density for particle sizes of 1-10 microns on a 1 micron thick layer of thin film was in the range of $10^6$ to $10^8$ particles per square centimeter using conventional laser beam and target configurations. In contrast, using the configuration of the present invention at the same deposition rate produced much smaller particulates at a density reduced to $10^5$ particles or fewer per square centimeter. This improvement is attributable to reduced splashing of particulates from surface 12 which remains smooth with few surface irregularities. In fact, experiments have shown that surface 12 becomes smoother after several runs of laser ablation. In addition to reduced splashing, reduced contamination, and improved efficiency resulting from the cylindrical target configuration, the steady laser induced plume 25 generated by the present invention improves the efficiency of oxygen or other gas injection for reactive deposition.

As illustrated in FIG. 1, laser beam 22 is focused along a line 24 at an angle with respect to the longitudinal axis of rotation 14 such that line 24 and axis 14 do not define a plane. By intentionally misaligning the focus of beam 22 on surface 12, line 24 covers a greater arc of surface 12 and produces an ablation plume 25 having a greater spread radially outward from surface 12. A greater spread, or fan width, of plume 25 deposits a uniform thin film over a larger area of substrate 30 and provides a larger "sweet spot" for positioning substrate 30. The range of useful alignment angles of line 24 depends on the length of line 24 and the diameter of target 10. As the length of line 24 is increased and the diameter of target 10 is decreased, the angle of line 24 with respect to axis 14 must be decreased to keep the laser beam sufficiently focused on cylindrical surface 12 to produce uniform ablation of the target material.

Figure 2:
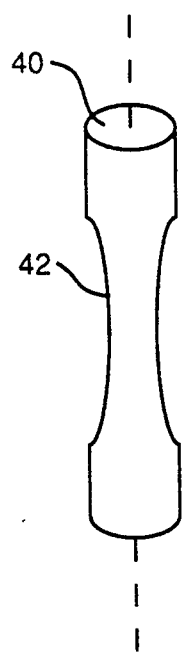
FIG. 2 is a generally cylindrical target of the present invention having a concave lateral surface area.

It has been discovered that the fan width of plume 25 can be increased in the longitudinal directions i.e., along axis 14, by modifying the shape of the surface of the target material. For example, FIG. 2 illustrates a generally cylindrical target 40 having a concave lateral surface 42. The concave surface 42 of target 40 may be pre-formed, but it is also likely to result from actual ablation of material from cylindrical target 10 as it is rotated about and translated along axis 14 with laser beam 22 focused along line 24. Concave surface 42 has the effect of causing the resulting plume of ablated material to fan out in the longitudinal directions. Thus, starting with cylindrical target 10, continued ablation of target material causes surface 12 to acquire the shape of surface 42 of target 40, thereby improving the thin film deposition by spreading the fan width of the plume as the process continues.

Figure 3:
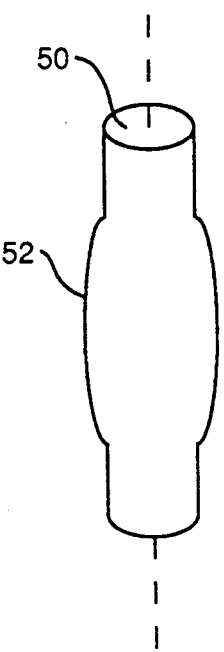
FIG. 3 is a generally cylindrical target of the present invention having a convex lateral surface area.

In another embodiment illustrated in FIG. 3, the target material is generally formed as target 50 having a convex lateral surface 52. Convex surface 52 also causes the plume of ablated material to fan out in the longitudinal directions when exposed to a laser beam focused along a line 24. Alternatively, target 50 may comprise a sphere of material that is rotated about an axis of rotation as its is exposed to a laser beam focused along line 24. It should be understood that these embodiments of the target of the present invention are described only as examples, and not limitations, because other target shapes that function to spread the plume of ablated material when exposed to a laser beam focused along a line will be obvious to one having ordinary skills in the art.

Although the present invention has been described with respect to specific embodiments thereof, various changes and modifications may be suggested to one skilled in the art. Therefore, it is intended that the present invention include such changes and modifications as fall within the scope of the appended claims.

I claim:

1. A method of laser ablation for depositing a thin film of material on a substrate, comprising the steps of:
   providing a target of deposition material, said target having a curved ablative surface rotatable about an axis of rotation, said curved ablative surface surrounding said axis of rotation and forming a generally circular line when taken in cross section perpendicular to said axis to rotation;
   rotating said curved ablative surface about said axis of rotation;
   focusing a laser beam on said rotating ablative surface along a line of incidence at an angle with respect to said axis of rotation such that said line of incidence and said axis do not form a plane;
   producing a plume of laser ablated material by action of said laser beam line on said rotating curved ablative surface; and
   positioning the substrate to receive said ablated material as a thin film deposit on the substrate.

2. The method of claim 1, further comprising the step of translating said target along said axis of rotation during laser ablation of said curved ablative surface.

3. The method of claim 2, wherein the step of providing a target comprises providing an elongated cylindrical target of material having a curved cylindrical side comprising said ablative surface.

4. A method of thin film deposition using laser ablation, comprising the steps of:
   providing a target having an axis of rotation and a curved ablative surface of deposition material extending around said axis, a cross section of said ablative surface forming a generally circular line when taken perpendicular to said axis of rotation;
   rotating said ablative surface about said axis of rotation;
   focusing a laser beam on said rotating ablative surface along a line of incidence such that said line of incidence and said axis of rotation are not coplanar;
   producing a broad plume of laser ablated material;
   positioning a substrate within said plume of ablated material; and depositing said ablated material in a thin film on said substrate.

5. The method of claim 4, wherein the step of providing a target comprises providing an elongated generally cylindrical target having a lateral ablative surface of deposition material.

6. The method of claim 5, wherein the step of providing a generally cylindrical target comprises providing a target having a concave lateral ablative surface for producing said broad plume of ablated material.

7. The method of claim 6, further comprising the step of translating said target along said axis of rotation during laser ablation of said concave lateral ablative surface.

8. A method of thin film deposition using laser ablation, comprising the steps of:

providing an elongated generally cylindrical target having a longitudinal axis of rotation and a curved elongated lateral ablative surface of deposition material surrounding and rotatable about said axis;

rotating said curved lateral ablative surface about said axis of rotation;

focusing a laser beam on said rotating ablative surface along a line at an angle of incidence such that said line and said axis of rotation do not define a plane;

translating said rotating curved ablative surface along said axis of rotation;

producing a broad plume of laser ablated material from said curved ablative surface;

positioning a substrate within said plume of ablated material; and depositing said ablated material in a uniform thin film on said substrate.

9. The method of claim 8, wherein the step of providing a generally cylindrical target comprises providing a target having a concave lateral ablative surface for producing said broad plume of laser ablated material.

10. The method of claim 8, wherein the step of providing a generally cylindrical target comprises providing a target having a convex lateral ablative surface for producing said broad plume of laser ablated material.

* * * * *